(12) United States Patent
Chen et al.

(10) Patent No.: US 10,771,070 B2
(45) Date of Patent: Sep. 8, 2020

(54) LOW VOLTAGE INVERTER-BASED AMPLIFIER

(71) Applicant: KaiKuTek Inc., Taipei (TW)

(72) Inventors: Pang-Ning Chen, Taipei (TW); Chen-Lun Lin, Taipei (TW); Ying-Chia Chen, Taipei (TW); Wei-Jyun Wang, Taipei (TW); Mike Chun-Hung Wang, Taipei (TW)

(73) Assignee: KAIKUTEK INC., Taipei (TW)

( * ) Notice: Subject to any disclaimer, the term of this patent is extended or adjusted under 35 U.S.C. 154(b) by 56 days.

(21) Appl. No.: 16/146,093

(22) Filed: Sep. 28, 2018

(65) Prior Publication Data

US 2019/0319596 A1    Oct. 17, 2019

Related U.S. Application Data

(60) Provisional application No. 62/656,999, filed on Apr. 13, 2018.

(51) Int. Cl.
| | |
|---|---|
| *H03F 3/45* | (2006.01) |
| *H03L 7/089* | (2006.01) |
| *H03L 7/081* | (2006.01) |
| *H03L 7/16* | (2006.01) |
| *G01S 7/35* | (2006.01) |
| *G01S 7/40* | (2006.01) |

(Continued)

(52) U.S. Cl.
CPC ........... *H03L 7/0891* (2013.01); *G01S 7/352* (2013.01); *G01S 7/40* (2013.01); *G01S 7/4021* (2013.01);

(Continued)

(58) Field of Classification Search
CPC ...... H03F 3/45636; H03F 3/10; H03F 1/0205; H03F 3/45475; H03F 3/19; H03F 1/32; H03F 2200/513; H03F 2203/45631; H03F 2203/45544; H03F 2203/45156; H03F 2200/451; H03F 2200/222

(Continued)

(56) References Cited

U.S. PATENT DOCUMENTS

| | | | | |
|---|---|---|---|---|
| 6,046,638 A | * | 4/2000 | Hogeboom | .......... H03K 5/2481 330/252 |
| 7,548,113 B2 | * | 6/2009 | Drottar | .................. H03F 1/086 330/253 |

* cited by examiner

*Primary Examiner* — Khanh V Nguyen
*Assistant Examiner* — Khiem D Nguyen
(74) *Attorney, Agent, or Firm* — Browdy and Neimark, PLLC

(57) ABSTRACT

A low voltage inverter-based amplifier includes a first inverter-based amplification module, a second inverter-based amplification module, an inverter-based feedforward module, and an inverter-based common mode detector. The first inverter-based amplification module receives an input signal. The second inverter-based amplification module receives the input signal through the inverter-based feedforward module, and receives a first output signal from the first inverter-based amplification module. The inverter-based common mode detector receives an amplified signal from the second inverter-based amplification module, and outputs a feedback signal to the second inverter-based amplification module. Since the first and the second inverter-based amplification modules are both inverter-based, the supply voltage of the low voltage inverter-based amplifier is provided to supply one PMOS and one NMOS for normal operation. Therefore, a number of cascade MOSs of the low voltage inverter-based amplifier is two, and the low voltage inverter-based amplifier can be normally operated under the low supply voltage.

12 Claims, 7 Drawing Sheets

(51) Int. Cl.
*G01S 13/34* (2006.01)
*H03B 5/04* (2006.01)
*H03B 5/12* (2006.01)
*H03H 7/06* (2006.01)
*H03L 7/099* (2006.01)
*H03F 1/32* (2006.01)
*H03F 3/19* (2006.01)
*H04B 1/18* (2006.01)
*H03F 1/02* (2006.01)
*H03F 3/10* (2006.01)

(52) U.S. Cl.
CPC .............. *G01S 13/343* (2013.01); *H03B 5/04* (2013.01); *H03B 5/1215* (2013.01); *H03F 1/0205* (2013.01); *H03F 1/32* (2013.01); *H03F 3/10* (2013.01); *H03F 3/19* (2013.01); *H03F 3/45475* (2013.01); *H03F 3/45636* (2013.01); *H03H 7/06* (2013.01); *H03L 7/0816* (2013.01); *H03L 7/0818* (2013.01); *H03L 7/099* (2013.01); *H03L 7/16* (2013.01); *H04B 1/18* (2013.01); *H03B 2200/004* (2013.01); *H03B 2200/0074* (2013.01); *H03B 2201/0208* (2013.01); *H03F 2200/222* (2013.01); *H03F 2200/451* (2013.01); *H03F 2200/513* (2013.01); *H03F 2203/45156* (2013.01); *H03F 2203/45544* (2013.01); *H03F 2203/45631* (2013.01)

(58) Field of Classification Search
USPC ............................................ 330/252–261, 9
See application file for complete search history.

LOW VOLTAGE INVERTER-BASED AMPLIFIER

BACKGROUND OF THE INVENTION

1. Field of the Invention

The present invention relates to an amplifier, and more particularly to a low voltage inverter-based amplifier.

2. Description of the Related Art

A common amplifier consists of a plurality of electronic elements, such as transistors and resistors. For example, a common operational amplifier, such as an LM741 operational amplifier, includes a plurality of transistors, and the transistors are electrically connected in series between a supply voltage terminal and a ground terminal.

However, an amount of the transistors electrically connected in series is related to a value of the supply voltage. When the amount of the transistors electrically connected in series increases, the value of the supply voltage needs to be increased to normally operate the operational amplifier. Namely, the common operational amplifier cannot be operated under a low supply voltage.

Therefore, the operational amplifier needs to be further improved.

SUMMARY OF THE INVENTION

An objective of the present invention is to provide a low voltage inverter-based amplifier. The present invention may be normally operated under a low supply voltage. The low voltage inverter-based amplifier includes a first inverter-based amplification module, a second inverter-based amplification module, an inverter-based feedforward module, and an inverter-based common mode detector.

The first inverter-based amplification module includes a first positive input and a first negative input to receive an input signal. The first inverter-based amplification module further includes a first positive output and a first negative output to output a first output signal.

The second inverter-based amplification module includes a second positive input and a second negative input to be electrically connected to the first inverter-based amplification module to receive the first output signal. The second inverter-based amplification module further includes a second positive output and a second negative output to output an amplified signal.

The inverter-based feedforward module receives the input signal, and is electrically connected to the second inverter-based amplification module to output a feedforward signal.

The inverter-based common mode detector is electrically connected to the second positive output and the second negative output to receive the amplified signal, and is electrically connected to the second inverter-based amplification module to output a feedback signal.

An inverter can be constructed using a P-type Metal-Oxide-Semiconductor (PMOS) and an N-type Metal-Oxide-Semiconductor (NMOS). The PMOS and the NMOS are constructed in a complementary metal-oxide-semiconductor (CMOS) configuration.

Since the first inverter-based amplification module and the second inverter-based amplification module are both inverter-based, the supply voltage of the low voltage inverter-based amplifier is provided to supply one PMOS and one NMOS for normal operation. Therefore, a number of cascade MOSs of the low voltage inverter-based amplifier is two, and the low voltage inverter-based amplifier can be normally operated under the low supply voltage.

DETAILED DESCRIPTION OF THE INVENTION

Figure 1:
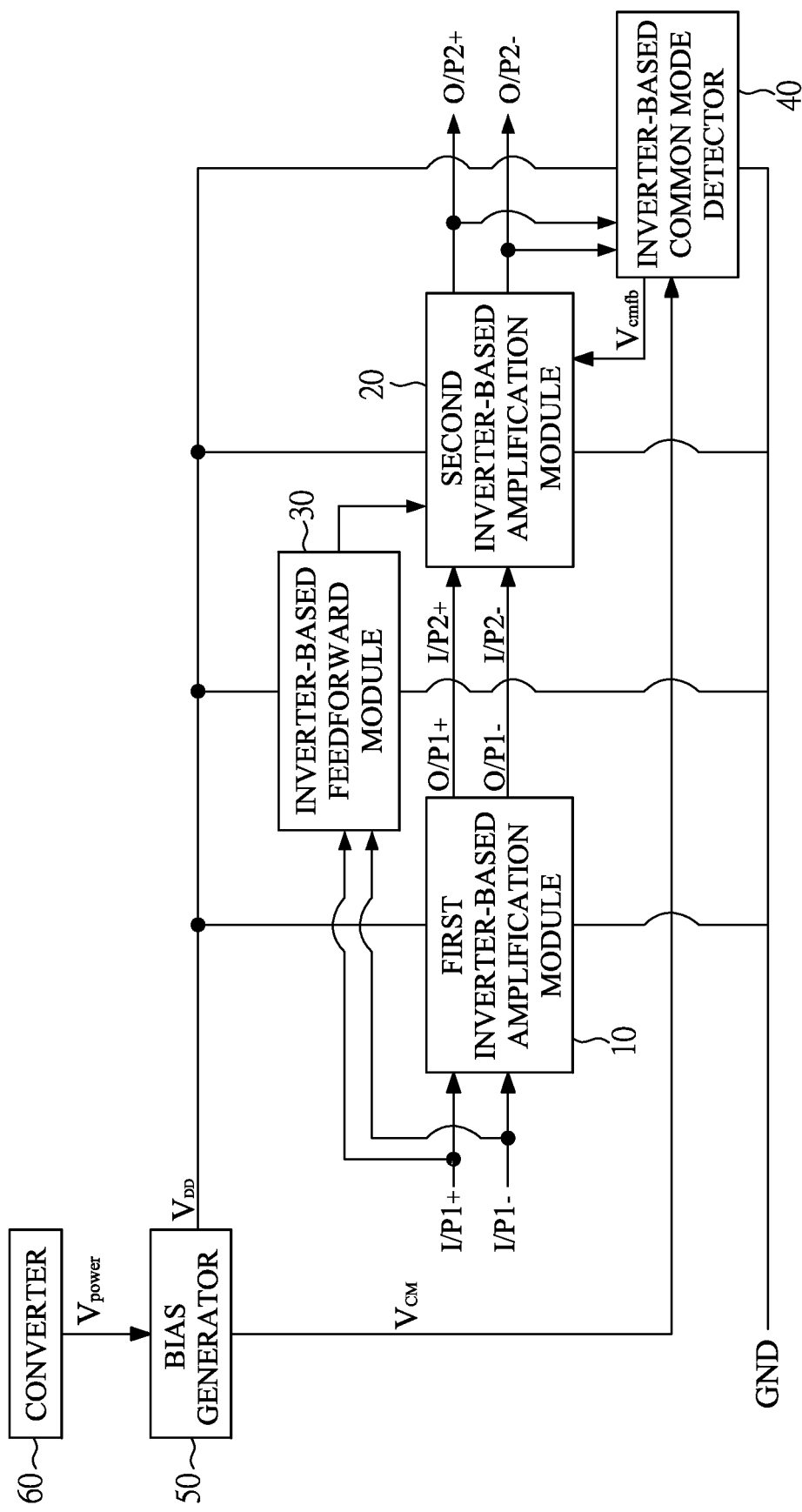
FIG. 1 is a block diagram of an embodiment of a low voltage inverter-based amplifier of the present invention.

With reference to FIG. 1, the present invention relates to a low voltage inverter-based amplifier. The low voltage inverter-based amplifier includes a first inverter-based amplification module 10, a second inverter-based amplification module 20, an inverter-based feedforward module 30, and an inverter-based common mode detector 40.

The first inverter-based amplification module 10 includes a first positive input I/P1+ and a first negative input I/P1− to receive an input signal. The first inverter-based amplification module 10 further includes a first positive output O/P1+ and a first negative output O/P1− to output a first output signal.

The second inverter-based amplification module 20 includes a second positive input I/P2+ and a second negative input I/P2− to be electrically connected to the first amplification module 10 to receive the first output signal. The second inverter-based amplification module 20 further includes a second positive output O/P2+ and a second negative output O/P2− to output an amplified signal.

The inverter-based feedforward module 30 receives the input signal, and is electrically connected to the second inverter-based amplification module 20 to output a feedforward signal.

The inverter-based common mode detector 40 is electrically connected to the second positive output O/P2+ and the second negative output O/P2− to receive the amplified signal, and is electrically connected to the second inverter-based amplification module 20 to output a feedback signal $V_{cmfb}$.

An inverter can be constructed using a P-type Metal-Oxide-Semiconductor (PMOS) and an N-type Metal-Oxide-Semiconductor (NMOS). The PMOS and the NMOS of the inverter are constructed in a complementary metal-oxide-semiconductor (CMOS) configuration.

Since the first inverter-based amplification module 10 and the second inverter-based amplification module 20 are both inverter-based, a supply voltage of the low voltage inverter-based amplifier is provided to supply just one PMOS and one NMOS for normal operation. Therefore, a number of cascade MOSs of the low voltage inverter-based amplifier is two, and the low voltage inverter-based amplifier can be normally operated under a low supply voltage. Further, the low voltage inverter-based amplifier does not need a tail current.

Moreover, the low voltage inverter-based amplifier further includes a bias generator 50, and the bias generator 50 generates a common mode voltage $V_{CM}$ and a supply voltage $V_{DD}$.

The first inverter-based amplification module 10, the second inverter-based amplification module 20, the inverter-based feedforward module 30, and the inverter-based common mode detector 40 are respectively electrically connected to the bias generator 50 to receive the supply voltage $V_{DD}$.

Figure 2:
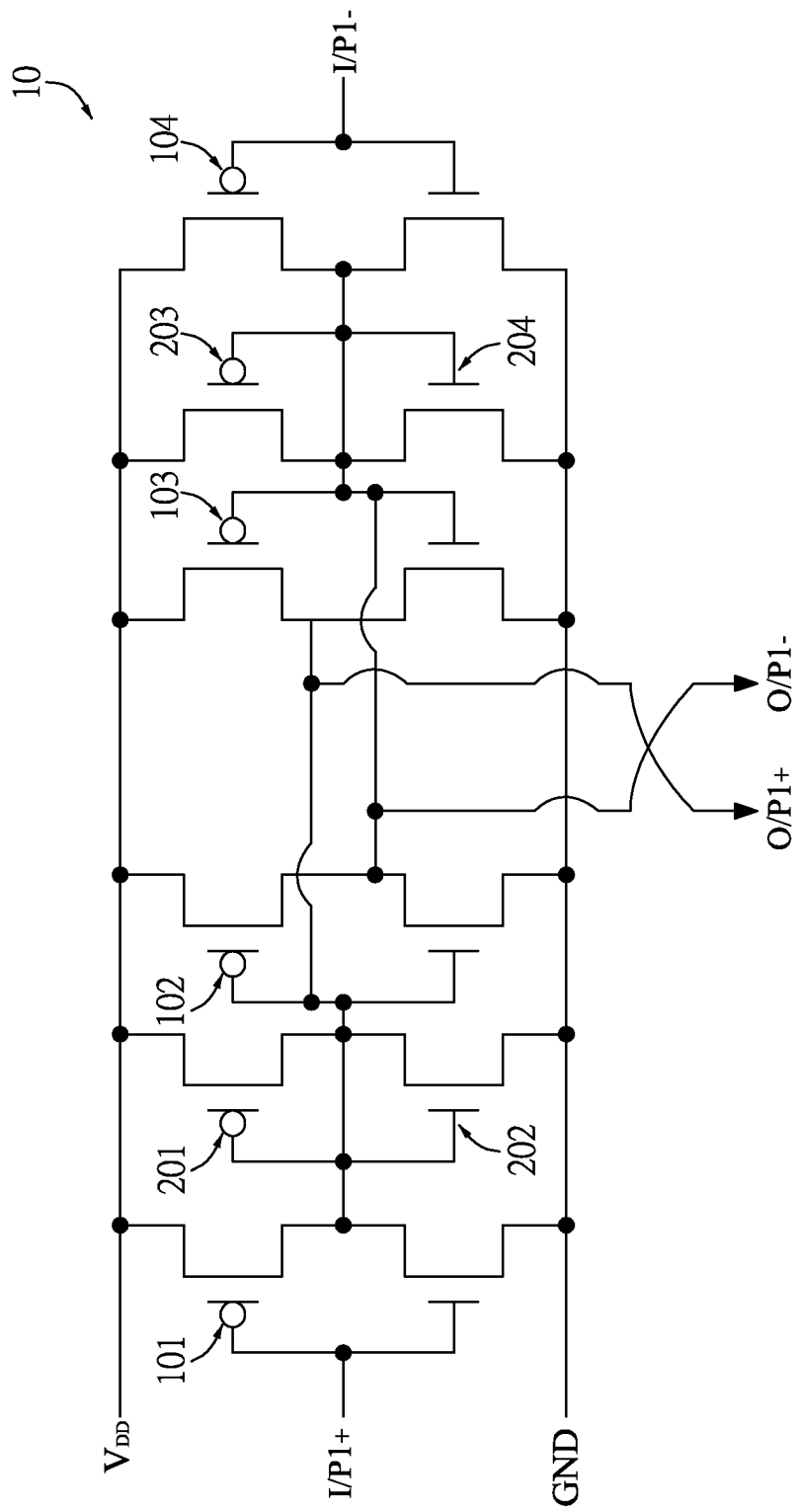
FIG. 2 is a circuit diagram of an embodiment of a first inverter-based amplification module of the low voltage inverter-based amplifier of the present invention.

With reference to FIG. 2, the first inverter-based amplification module 10 includes a first inverter 101, a second inverter 102, a third inverter 103, a fourth inverter 104, a first load 201, a second load 202, a third load 203, and a fourth load 204.

The first inverter 101 includes an inverter input and an inverter output. The inverter input of the first inverter 101 is the first positive input I/P1+ of the first inverter-based amplification module 10.

The inverter output of the first inverter 101 is electrically connected to the bias generator 50 through the first load 201 to receive the supply voltage $V_{DD}$. The inverter output of the first inverter 101 is electrically connected to a ground GND through the second load 202.

The second inverter 102 includes an inverter input and an inverter output. The inverter input of the second inverter 102 is electrically connected to the inverter output of the first inverter 101, and the inverter output of the second inverter 102 is the first negative output O/P1− of the first inverter-based amplification module 10.

The third inverter 103 includes an inverter input and an inverter output. The inverter output of the third inverter 103 is electrically connected to the inverter input of the second inverter 102, and the inverter input of the third inverter 103 is electrically connected to the inverter output of the second inverter 102. Further, the inverter output of the third inverter 103 is the first positive output O/P1+ of the first inverter-based amplification module 10.

The inverter input of the third inverter 103 is electrically connected to the bias generator 50 through the third load 203 to receive the supply voltage $V_{DD}$. The inverter input of the third inverter 103 is electrically connected to the ground GND through the fourth load 204.

The fourth inverter 104 includes an inverter input and an inverter output. The inverter output of the fourth inverter 104 is electrically connected to the inverter input of the third inverter 103, and the inverter input of the fourth inverter 104 is the first negative input I/P1− of the first inverter-based amplification module 10.

The first inverter 101, the second inverter 102, the third inverter 103, and the fourth inverter 104 each include a PMOS and an NMOS.

In each of the first inverter 101, the second inverter 102, the third inverter 103, and the fourth inverter 104, a source of the PMOS is electrically connected to the bias generator 50 to receive the supply voltage $V_{DD}$. Further, a gate of the NMOS is electrically connected to a gate of the PMOS, a drain of the NMOS is electrically connected to a drain of the PMOS, and a source of the NMOS is electrically connected to the ground GND. Moreover, the gate of the PMOS is the inverter input, and the drain of the PMOS is the inverter output.

Accordingly, the first inverter-based amplification module 10 receives the supply voltage $V_{DD}$ from the bias generator 50, and the supply voltage $V_{DD}$ is just used to supply the inverters for normally operating. Therefore, the low voltage inverter-based amplifier is good for low voltage operation.

Figure 3:
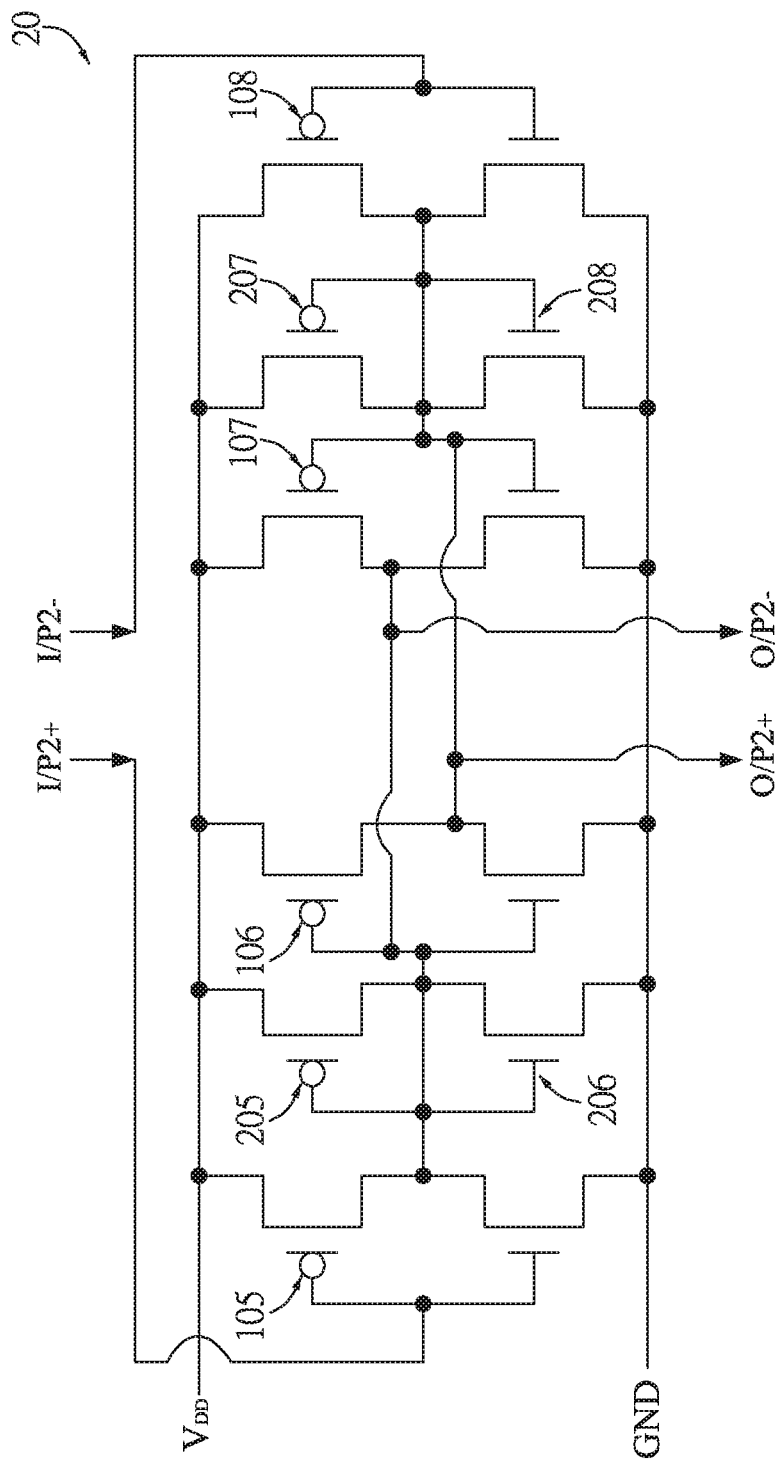
FIG. 3 is a circuit diagram of an embodiment of a second inverter-based amplification module of the low voltage inverter-based amplifier of the present invention.

With reference to FIG. 3, the second inverter-based amplification module 20 includes a fifth inverter 105, a sixth inverter 106, a seventh inverter 107, a eighth inverter 108, a fifth load 205, a sixth load 206, an seventh load 207, and an eighth load 208.

The fifth inverter 105 includes an inverter input and an inverter output. The inverter input of the fifth inverter 105 is the second positive input I/P2+ of the second inverter-based amplification module 20.

The inverter output of the fifth inverter 105 is electrically connected to the bias generator 50 through the fifth load 205 to receive the supply voltage $V_{DD}$. The inverter output of the fifth inverter 105 is electrically connected to the ground GND through the sixth load 206.

The sixth inverter 106 includes an inverter input and an inverter output. The inverter input of the sixth inverter 106 is electrically connected to the inverter output of the fifth inverter 105, and the inverter output of the sixth inverter 106 is the second positive output O/P2+ of the second inverter-based amplification module 20.

The seventh inverter 107 includes an inverter input and an inverter output. The inverter output of the seventh inverter 107 is electrically connected to the inverter input of the sixth inverter 106, and the inverter input of the seventh inverter 107 is electrically connected to the inverter output of the sixth inverter 106. Further, the inverter output of the seventh inverter 107 is the second negative output O/P2− of the second inverter-based amplification module 20.

The inverter input of the seventh inverter 107 is electrically connected to the bias generator 50 through the seventh load 207 to receive the supply voltage $V_{DD}$. The inverter input of the seventh inverter 107 is electrically connected to the ground GND through the eighth load 208.

The eighth inverter 108 includes an inverter input and an inverter output. The inverter output of the eighth inverter 108 is electrically connected to the inverter input of the seventh inverter 107, and the inverter input of the eighth inverter 108 is the second negative input I/P2− of the second inverter-based amplification module 20.

The fifth inverter 105, the sixth inverter 106, the seventh inverter 107, and the eighth inverter 108 each include a PMOS and an NMOS.

In each of the fifth inverter 105, the sixth inverter 106, the seventh inverter 107, and the eighth inverter 108, a source of the PMOS is electrically connected to the bias generator 50 to receive the supply voltage $V_{DD}$. Further, a gate of the NMOS is electrically connected to a gate of the PMOS, a drain of the NMOS is electrically connected to a drain of the PMOS, and a source of the NMOS is electrically connected to the ground GND. Moreover, the gate of the PMOS is the inverter input, and the drain of the PMOS is the inverter output.

Figure 4:
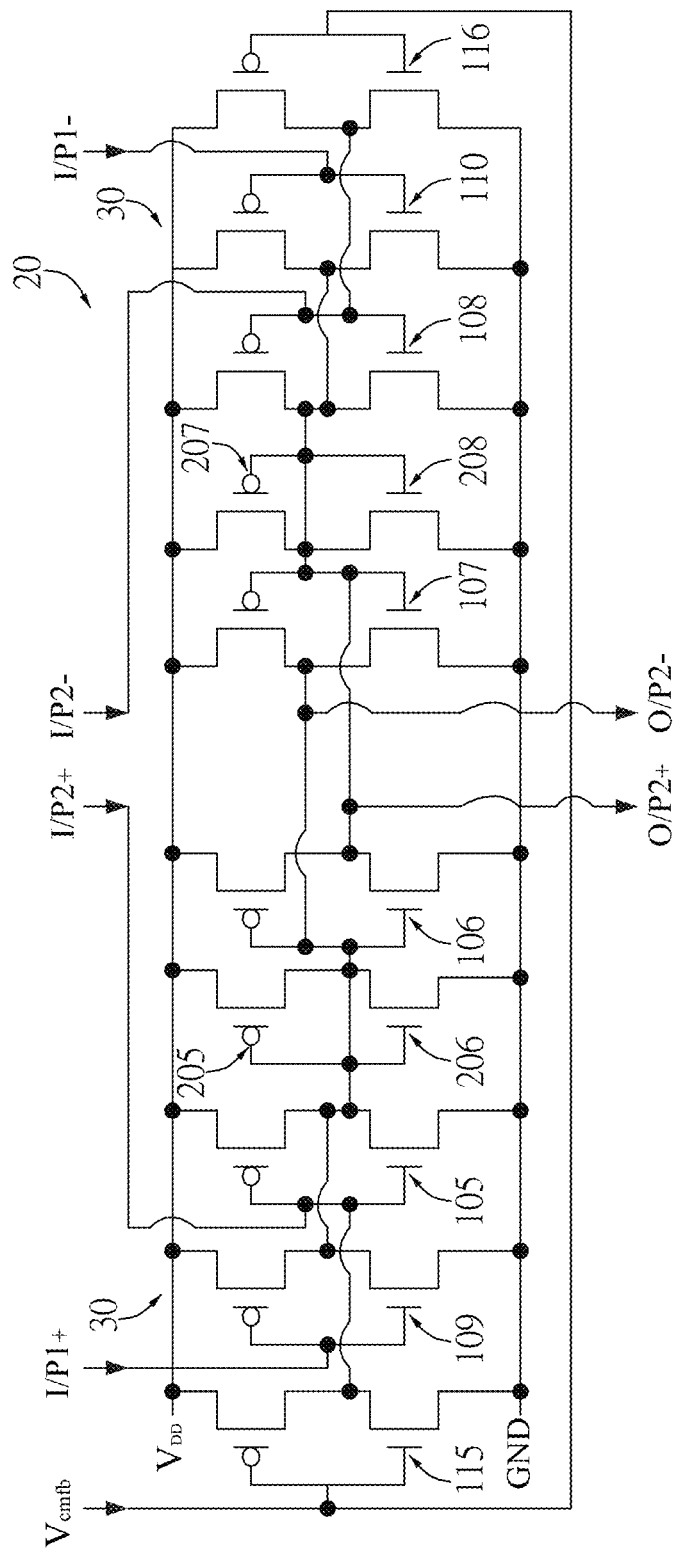
FIG. 4 is a circuit diagram of an embodiment of the second inverter-based amplification module and a feedforward module of the low voltage inverter-based amplifier of the present invention.

With reference to FIG. 4, the inverter-based feedforward module 30 includes a ninth inverter 109, and a tenth inverter 110.

The ninth inverter 109 includes an inverter input and an inverter output. The inverter input of the ninth inverter 109 is electrically connected to the first positive input I/P1+, and the inverter output of the ninth inverter 109 is electrically connected to the inverter output of the fifth inverter 105.

The tenth inverter 110 includes an inverter input and an inverter output. The inverter output of the tenth inverter 110 is electrically connected to the inverter output of the eighth inverter 108, and the inverter input of the tenth inverter 110 is electrically connected to the first negative input I/P1−.

The inverter output of the ninth inverter 109 and the inverter output of the tenth inverter 110 output the feedforward signal.

The ninth inverter 109 and the tenth inverter 110 each include a PMOS and an NMOS.

In each of the ninth inverter 109 and the tenth inverter 110, a source of the PMOS is electrically connected to the bias generator to receive the supply voltage $V_{DD}$. Further, a gate of the NMOS is electrically connected to a gate of the PMOS, a drain of the NMOS is electrically connected to a drain of the PMOS, and a source of the NMOS is electrically connected to the ground GND. Moreover, the gate of the PMOS is the inverter input, and the drain of the PMOS is the inverter output.

When the input signal is a direct current (DC) signal, the input signal can be amplified through the first inverter-based amplification module 10 and the second inverter-based amplification module 20. Therefore, the amplified signal can be amplified through a high-gain DC path. Moreover, when the input signal is an alternating current (AC) signal with a high frequency, the input signal can be amplified through the inverter-based feedforward module 30 and the second inverter-based amplification module 20. Namely, the amplified signal can be amplified through just one amplification module to improve performance of the low voltage inverter-based amplifier when the input signal is a high frequency AC signal. Therefore, the amplified signal can be amplified through a high-bandwidth feedforward path.

Figure 5:
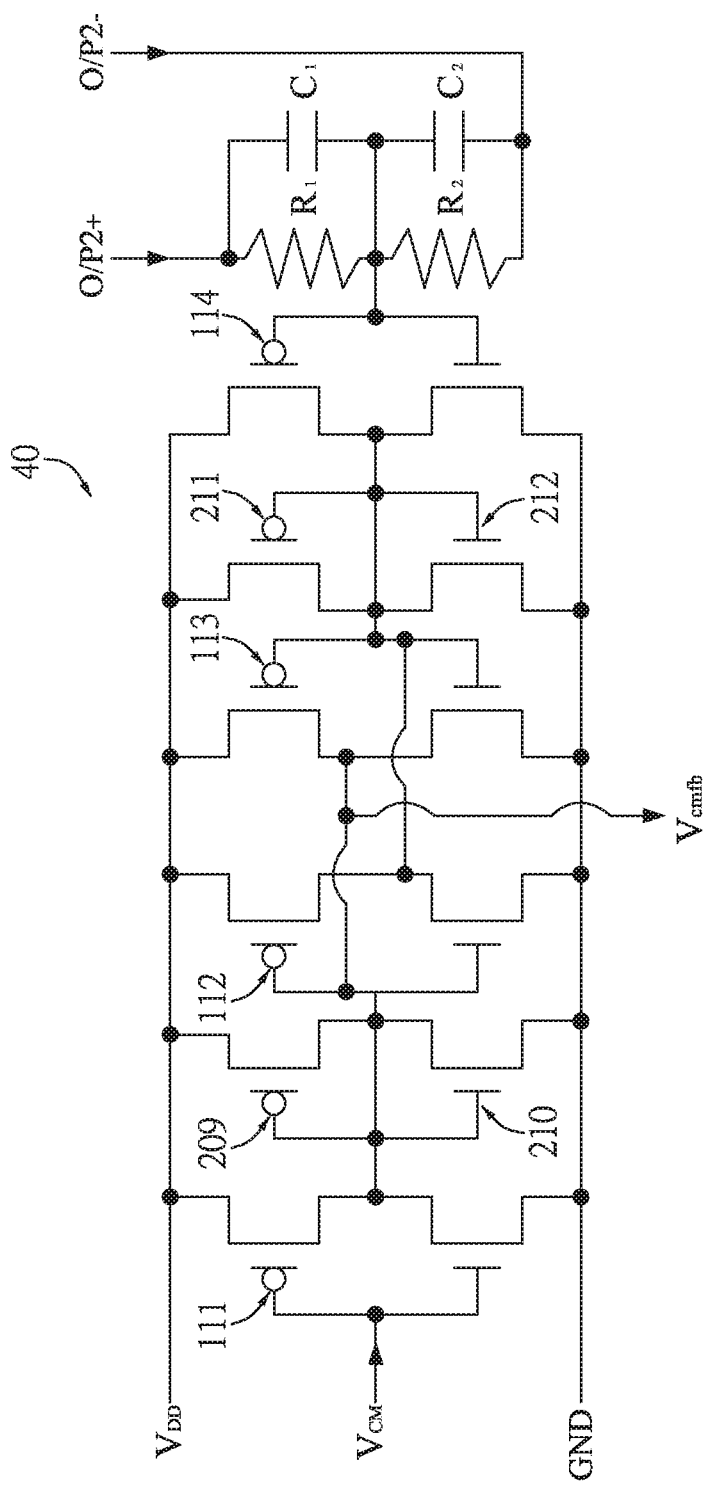
FIG. 5 is a circuit diagram of an embodiment of a common mode detector of the low voltage inverter-based amplifier of the present invention.

With reference to FIG. 5, the inverter-based common mode detector 40 includes a eleventh inverter 111, a twelfth inverter 112, an thirteenth inverter 113, a fourteenth inverter 114, a ninth load 209, a tenth load 210, a eleventh load 211, a twelfth load 212, a first resistor $R_1$, a second resistor $R_2$, a first capacitor $C_1$, and a second capacitor $C_2$.

The eleventh inverter 111 includes an inverter input and an inverter output. The inverter input of the eleventh inverter 111 is electrically connected to the bias generator 50 to receive the common mode voltage $V_{CM}$.

The inverter output of the eleventh inverter 111 is electrically connected to the bias generator 50 through the ninth load 209 to receive the supply voltage $V_{DD}$. The inverter output of the eleventh inverter 111 is electrically connected to the ground GND through the tenth load 210.

The twelfth inverter 112 includes an inverter input and an inverter output. The inverter input of the twelfth inverter 112 is electrically connected to the inverter output of the eleventh inverter 111.

The thirteenth inverter 113 includes an inverter input and an inverter output. The inverter output of the thirteenth inverter 113 is electrically connected to the inverter input of the twelfth inverter 112, and the inverter input of the thirteenth inverter 113 is electrically connected to the inverter output of the twelfth inverter 112. Further, the inverter output of the thirteenth inverter 113 outputs the feedback signal $V_{cmfb}$.

The inverter input of the thirteenth inverter 113 is electrically connected to the bias generator 50 through the eleventh load 211 to receive the supply voltage $V_{DD}$. The inverter input of the thirteenth inverter 113 is electrically connected to the ground GND through the twelfth load 212.

The fourteenth inverter 114 includes an inverter input and an inverter output. The inverter output of the fourteenth inverter 114 is electrically connected to the inverter input of the thirteenth inverter 113.

The first resistor $R_1$ is electrically connected between the second positive output O/P2+ and the inverter input of the fourteenth inverter 114.

The second resistor $R_2$ is electrically connected between the second negative output O/P2− and the inverter input of the fourteenth inverter 114.

The first capacitor $C_1$ is electrically connected between the second positive output O/P2+ and the inverter input of the fourteenth inverter 114.

The second capacitor $C_2$ is electrically connected between the second negative output O/P2− and the inverter input of the fourteenth inverter 114.

The eleventh inverter 111, the twelfth inverter 112, the thirteenth inverter 113, and the fourteenth inverter 114 each include a PMOS and an NMOS.

In each of the eleventh inverter 111, the twelfth inverter 112, the thirteenth inverter 113, and the fourteenth inverter 114, a source of the PMOS is electrically connected to the bias generator to receive the supply voltage $V_{DD}$. Further, a gate of the NMOS is electrically connected to a gate of the PMOS, a drain of the NMOS is electrically connected to a drain of the PMOS, and a source of the NMOS is electrically connected to the ground GND. Moreover, the gate of the PMOS is the inverter input, and the drain of the PMOS is the inverter output.

Figure 6:
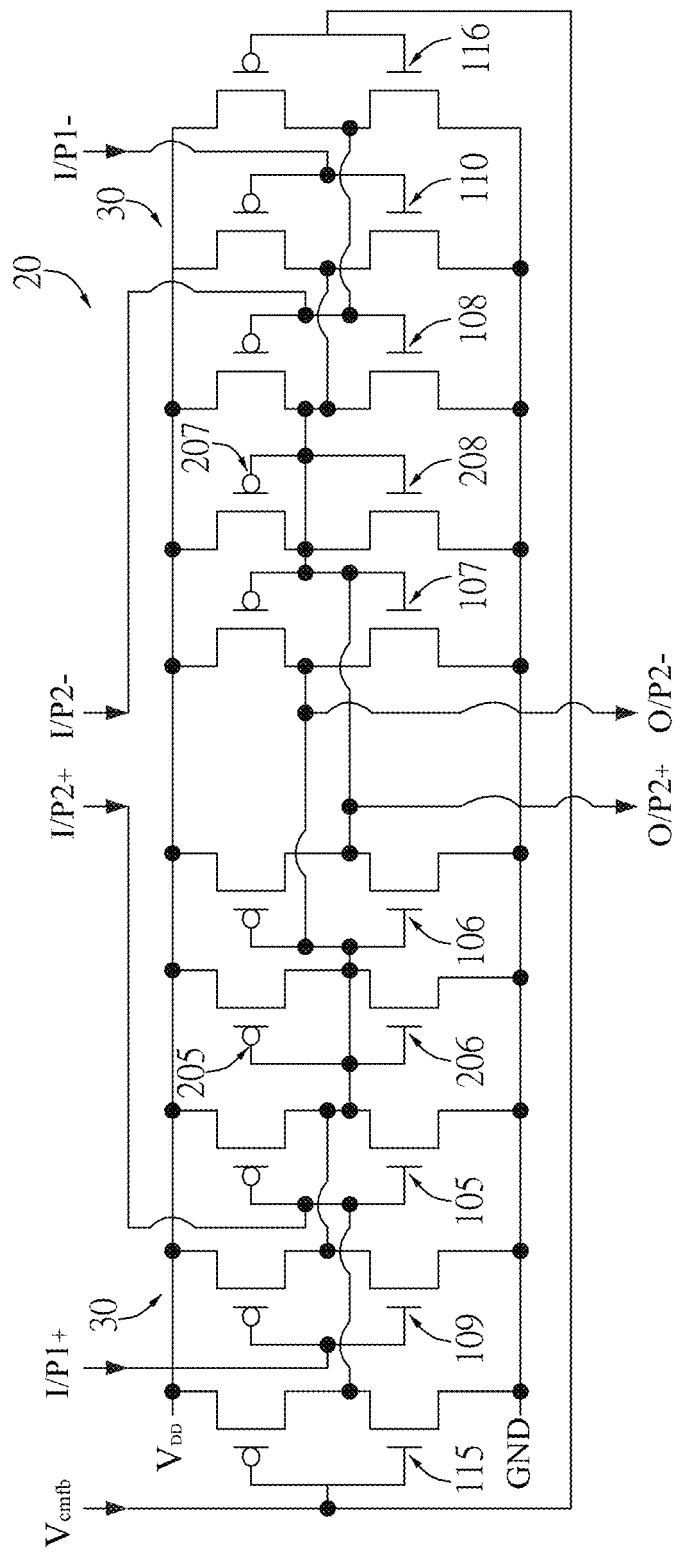
FIG. 6 is a circuit diagram of another embodiment of the second inverter-based amplification module and the feedforward module of the low voltage inverter-based amplifier of the present invention.

With reference to FIG. 6, the second inverter-based amplification module 20 further includes a fifteenth inverter 115 and a sixteenth inverter 116.

The fifteenth inverter 115 includes an inverter input and an inverter output. The inverter output of the fifteenth inverter 115 is electrically connected to the inverter input of the fifth inverter 105, and the inverter input of the fifteenth inverter 115 is electrically connected to the inverter output of the thirteenth inverter 113 to receive the feedback signal $V_{cmfb}$.

The sixteenth inverter 116 includes an inverter input and an inverter output. The inverter output of the sixteenth inverter 116 is electrically connected to the inverter input of the eighth inverter 108, and the inverter input of the sixteenth inverter 116 is electrically connected to the inverter output of the thirteenth inverter 113 to receive the feedback signal $V_{cmfb}$.

The fifteenth inverter 115 and the sixteenth inverter 116 each include a PMOS and an NMOS.

In each of the fifteenth inverter 115 and the sixteenth inverter 116, a source of the PMOS is electrically connected to the bias generator 50 to receive the supply voltage $V_{DD}$. Further, a gate of the NMOS is electrically connected to a gate of the PMOS, a drain of the NMOS is electrically connected to a drain of the PMOS, and a source of the NMOS is electrically connected to the ground GND. Moreover, the gate of the PMOS is the inverter input, and the drain of the PMOS is the inverter output.

Figure 7:
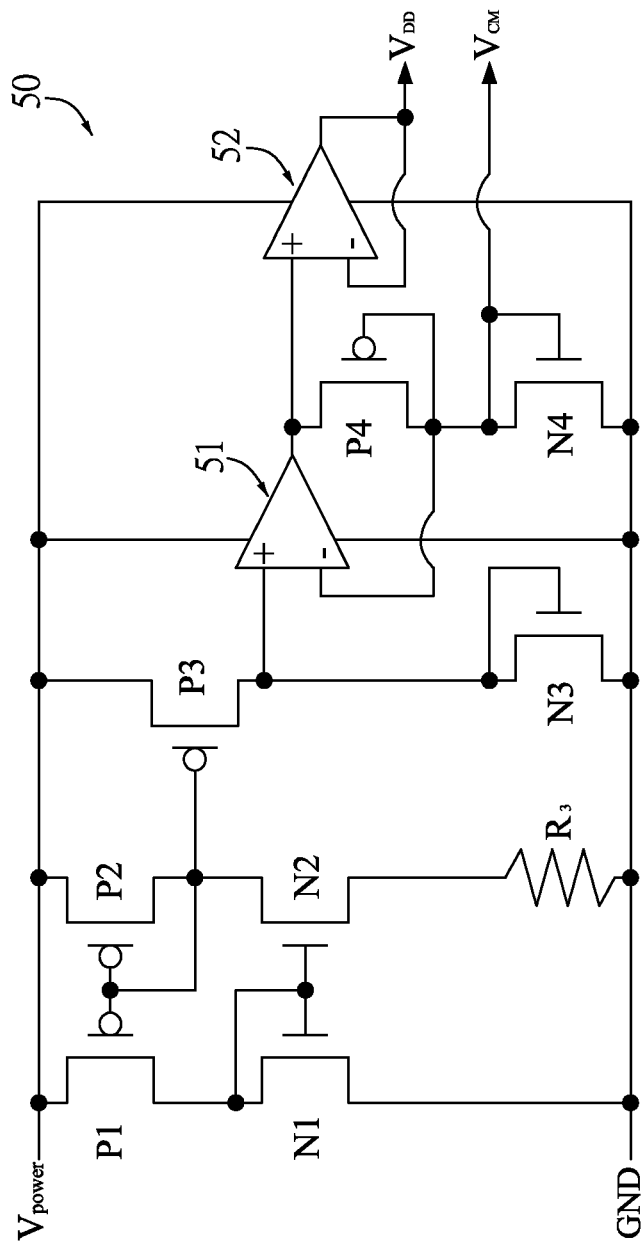
FIG. 7 is a circuit diagram of an embodiment of a bias generator of the low voltage inverter-based amplifier of the present invention.

With reference to FIGS. 1 and 7, the bias generator 50 is electrically connected to a converter 60 to receive a power supply voltage $V_{power}$, and the bias generator 50 includes a first PMOS P1, a second PMOS P2, a third PMOS P3, a fourth PMOS P4, a first NMOS N1, a second NMOS N2, a third NMOS N3, a fourth NMOS P4, a third resistor $R_3$, a first amplifier 51, and a second amplifier 52.

A source of the first PMOS P1 is electrically connected to the converter to receive the power supply voltage $V_{power}$.

A source of the second PMOS P2 is electrically connected to the converter to receive the power supply voltage $V_{power}$, and a gate of the second PMOS P2 is electrically connected to a gate of the first PMOS P1 and a drain of the second PMOS P2.

A source of the third PMOS P3 is electrically connected to the converter to receive the power supply voltage $V_{power}$, and a gate of the third PMOS P3 is electrically connected to the drain of the second PMOS P2.

A drain of the first NMOS M1 is electrically connected to a drain of the first PMOS P1 and a gate of the first NMOS N1, and a source of the first NMOS N1 is electrically connected to the ground GND.

A drain of the second NMOS N2 is electrically connected to the drain of the second PMOS P2, and a gate of the second NMOS N2 is electrically connected to the gate of the first NMOS N1.

The third resistor $R_3$ is electrically connected between a source of the second NMOS N2 and the ground GND.

A drain of the third NMOS N3 is electrically connected to a drain of the third PMOS P3 and a gate of the third NMOS N3, and a source of the third NMOS N3 is electrically connected to the ground GND.

The first amplifier 51 includes a first positive port, a first negative port, a first positive power port, a first negative power port, and a first output port. The first positive port is electrically connected to the drain of the third PMOS P3, the first positive power port is electrically connected to the converter to receive the power supply voltage $V_{power}$, and the first negative power port is electrically connected to the ground GND.

A source of the fourth PMOS P4 is electrically connected to the first output port, and a gate of the fourth PMOS P4 is electrically connected to a drain of the fourth PMOS P4 and the first negative port.

A drain of the fourth NMOS N4 is electrically connected to a gate of the fourth NMOS N4, the drain of the fourth NMOS N4 outputs the common mode voltage $V_{CM}$, and a source of the fourth NMOS N4 is electrically connected to the ground GND.

The second amplifier 52 includes a second positive port, a second negative port, a second positive power port, a second negative power port, and a second output port. The second positive port is electrically connected to the first output port, the second negative port is electrically connected to the second output port, the second positive power port is electrically connected to the converter to receive the power supply voltage $V_{power}$, the second negative power port is electrically connected to the ground GND, and the second output port outputs the supply voltage $V_{DD}$.

Since the bias generator 50 is an adaptive supply generator, the bias generator 50 can ensure constant-gm over process, voltage and temperature (PVT) variation.

In the above embodiments, the second PMOS P2 and the fourth PMOS P4 are each a diode connected PMOS, and the first NMOS, the third NMOS, and the fourth NMOS are each a diode connected NMOS.

Further, in the above embodiments, the first load 201, the third load 203, the fifth load 205, the seventh load 207, the ninth load 209, and eleventh load 211 each are a diode connected PMOS. The second load 202, the fourth load 204, the sixth load 206, the eighth load 208, the tenth load 210, and the twelfth load 212 each are a diode connected NMOS. A source of the diode connected PMOS is electrically connected to the bias generator 50 to receive the supply voltage $V_{DD}$. A gate of the diode connected PMOS is electrically connected to a drain of the diode connected PMOS, and a gate of the diode connected NMOS. The gate of the diode connected NMOS is electrically connected to a drain of the diode connected NMOS. A source of the diode connected NMOS is electrically connected to the ground GND.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A low voltage inverter-based amplifier, comprising:
    a first inverter-based amplification module, comprising a first positive input and a first negative input to receive an input signal; wherein the first inverter-based amplification module further comprises a first positive output and a first negative output to output a first output signal;
    a second inverter-based amplification module, comprising a second positive input and a second negative input to be electrically connected to the first inverter-based amplification module to receive the first output signal; wherein the second inverter-based amplification module further comprises a second positive output and a second negative output to output an amplified signal;
    an inverter-based feedforward module, receiving the input signal, and electrically connected to the second inverter-based amplification module to output a feedforward signal; and
    an inverter-based common mode detector, electrically connected to the second positive output and the second negative output to receive the amplified signal, and electrically connected to the second inverter-based amplification module to output a feedback signal.

2. The low voltage inverter-based amplifier as claimed in claim 1, further comprising:
    a bias generator, generating a common mode voltage and a supply voltage;
    wherein the first inverter-based amplification module, the second inverter-based amplification module, the inverter-based feedforward module, and the inverter-based common mode detector are respectively electrically connected to the bias generator to receive the supply voltage.

3. The low voltage inverter-based amplifier as claimed in claim 2, wherein the first inverter-based amplification module comprises:
    a first inverter, comprising an inverter input and an inverter output; wherein the inverter input of the first inverter is the first positive input of the first inverter-based amplification module;
    a first load; wherein the inverter output of the first inverter is electrically connected to the bias generator through the first load to receive the supply voltage;
    a second load; wherein the inverter output of the first inverter is electrically connected to a ground through the second load;
    a second inverter, comprising an inverter input and an inverter output; wherein the inverter input of the second inverter is electrically connected to the inverter output of the first inverter, and the inverter output of the second inverter is the first negative output of the first inverter-based amplification module;

a third inverter, comprising an inverter input and an inverter output; wherein the inverter output of the third inverter is electrically connected to the inverter input of the second inverter, and the inverter input of the third inverter is electrically connected to the inverter output of the second inverter; wherein the inverter output of the third inverter is the first positive output of the first inverter-based amplification module;

a third load; wherein the inverter input of the third inverter is electrically connected to the bias generator through the third load to receive the supply voltage;

a fourth load; wherein the inverter input of the third inverter is electrically connected to the ground through the fourth load; and a fourth inverter, comprising an inverter input and an inverter output; wherein the inverter output of the fourth inverter is electrically connected to the inverter input of the third inverter, and the inverter input of the fourth inverter is the first negative input of the first inverter-based amplification module;

wherein the first inverter, the second inverter, the third inverter, and the fourth inverter each comprise:
  a P-type Metal-Oxide-Semiconductor (PMOS); wherein a source of the PMOS is electrically connected to the bias generator to receive the supply voltage; and
  an N-type Metal-Oxide-Semiconductor (NMOS); wherein a gate of the NMOS is electrically connected to a gate of the PMOS, a drain of the NMOS is electrically connected to a drain of the PMOS, and a source of the NMOS is electrically connected to the ground;
  wherein the gate of the PMOS is the inverter input, and the drain of the PMOS is the inverter output.

4. The low voltage inverter-based amplifier as claimed in claim 3, wherein the first load and the third load are each a diode connected PMOS;
  wherein the second load and the fourth load are each a diode connected NMOS;
  wherein a source of the diode connected PMOS is electrically connected to the bias generator to receive the supply voltage;
  wherein a gate of the diode connected PMOS is electrically connected to a drain of the diode connected PMOS, and a gate of the diode connected NMOS;
  wherein the gate of the diode connected NMOS is electrically connected to a drain of the diode connected NMOS;
  wherein a source of the diode connected NMOS is electrically connected to the ground.

5. The low voltage inverter-based amplifier as claimed in claim 2, wherein the second inverter-based amplification module comprises:
  a fifth inverter, comprising an inverter input and an inverter output; wherein the inverter input of the fifth inverter is the second positive input of the second inverter-based amplification module;
  a fifth load; wherein the inverter output of the fifth inverter is electrically connected to the bias generator through the fifth load to receive the supply voltage;
  a sixth load; wherein the inverter output of the fifth inverter is electrically connected to the ground through the sixth load;
  a sixth inverter, comprising an inverter input and an inverter output; wherein the inverter input of the sixth inverter is electrically connected to the inverter output of the fifth inverter, and the inverter output of the sixth inverter is the second positive output of the second inverter-based amplification module;

a seventh inverter, comprising an inverter input and an inverter output; wherein the inverter output of the seventh inverter is electrically connected to the inverter input of the sixth inverter, and the inverter input of the seventh inverter is electrically connected to the inverter output of the sixth inverter; wherein the inverter output of the seventh inverter is the second negative output of the second inverter-based amplification module;

a seventh load; wherein the inverter input of the seventh inverter is electrically connected to the bias generator through the seventh load to receive the supply voltage;

an eighth load; wherein the inverter input of the seventh inverter is electrically connected to the ground through the eighth load; and an eighth inverter, comprising an inverter input and an inverter output; wherein the inverter output of the eighth inverter is electrically connected to the inverter input of the seventh inverter, and the inverter input of the eighth inverter is the second negative input of the second inverter-based amplification module;

wherein the fifth inverter, the sixth inverter, the seventh inverter, and the eighth inverter each comprise:
    a PMOS; wherein a source of the PMOS is electrically connected to the bias generator to receive the supply voltage; and
    an NMOS; wherein a gate of the NMOS is electrically connected to a gate of the PMOS, a drain of the NMOS is electrically connected to a drain of the PMOS, and a source of the NMOS is electrically connected to the ground;
    wherein the gate of the PMOS is the inverter input, and the drain of the PMOS is the inverter output.

6. The low voltage inverter-based amplifier as claimed in claim 5, wherein the fifth load and the seventh load are each a diode connected PMOS;
  wherein the sixth load and the eighth load are each a diode connected NMOS;
  wherein a source of the diode connected PMOS is electrically connected to the bias generator to receive the supply voltage;
  wherein a gate of the diode connected PMOS is electrically connected to a drain of the diode connected PMOS, and a gate of the diode connected NMOS;
  wherein the gate of the diode connected NMOS is electrically connected to a drain of the diode connected NMOS;
  wherein a source of the diode connected NMOS is electrically connected to the ground.

7. The low voltage inverter-based amplifier as claimed in claim 5, wherein the inverter-based feedforward module comprises:
  a ninth inverter, comprising an inverter input and an inverter output; wherein the inverter input of the ninth inverter is electrically connected to the first positive input, and the inverter output of the ninth inverter is electrically connected to the inverter output of the fifth inverter; and
  a tenth inverter, comprising an inverter input and an inverter output; wherein the inverter output of the tenth inverter is electrically connected to the inverter output of the eighth inverter, and the inverter input of the tenth inverter is electrically connected to the first negative input;

wherein the inverter output of the ninth inverter and the inverter output of the tenth inverter output the feedforward signal;

wherein the ninth inverter and the tenth inverter each comprise:
  a PMOS; wherein a source of the PMOS is electrically connected to the bias generator to receive the supply voltage;
  an NMOS; wherein a gate of the NMOS is electrically connected to a gate of the PMOS, a drain of the NMOS is electrically connected to a drain of the PMOS, and a source of the NMOS is electrically connected to the ground;
  wherein the gate of the PMOS is the inverter input, and the drain of the PMOS is the inverter output.

8. The low voltage inverter-based amplifier as claimed in claim 7, wherein inverter-based common mode detector comprises:
  an eleventh inverter, comprising an inverter input and an inverter output; wherein the inverter input of the eleventh inverter is electrically connected to the bias generator to receive the common mode voltage;
  a ninth load; wherein the inverter output of the eleventh inverter is electrically connected to the bias generator through the ninth load to receive the supply voltage;
  a tenth load; wherein the inverter output of the eleventh inverter is electrically connected to the ground through the tenth load;
  a twelfth inverter, comprising an inverter input and an inverter output; wherein the inverter input of the twelfth inverter is electrically connected to the inverter output of the eleventh inverter;
  a thirteenth inverter, comprising an inverter input and an inverter output; wherein the inverter output of the thirteenth inverter is electrically connected to the inverter input of the twelfth inverter, the inverter input of the thirteenth inverter is electrically connected to the inverter output of the twelfth inverter, and the inverter output of the thirteenth inverter outputs the feedback signal;
  an eleventh load; wherein the inverter input of the thirteenth inverter is electrically connected to the bias generator through the eleventh load to receive the supply voltage;
  a twelfth load; wherein the inverter input of the thirteenth inverter is electrically connected to the ground through the twelfth load;
  a fourteenth inverter, comprising an inverter input and an inverter output; wherein the inverter output of the fourteenth inverter is electrically connected to the inverter input of the thirteenth inverter;
  a first resistor, electrically connected between the second positive output and the inverter input of the fourteenth inverter;
  a second resistor, electrically connected between the second negative output and the inverter input of the fourteenth inverter;
  a first capacitor, electrically connected between the second positive output and the inverter input of the fourteenth inverter; and
  a second capacitor, electrically connected between the second negative output and the inverter input of the fourteenth inverter;
  wherein the eleventh inverter, the twelfth inverter, the thirteenth inverter, and the fourteenth inverter each comprise:
    a PMOS; wherein a source of the PMOS is electrically connected to the bias generator to receive the supply voltage;
    an NMOS; wherein a gate of the NMOS is electrically connected to a gate of the PMOS, a drain of the NMOS is electrically connected to a drain of the PMOS, and a source of the NMOS is electrically connected to the ground;
    wherein the gate of the PMOS is the inverter input, and the drain of the PMOS is the inverter output.

9. The low voltage inverter-based amplifier as claimed in claim 8, wherein the ninth load and the eleventh load are each a diode connected PMOS;
  wherein the tenth load and the twelfth load are each a diode connected NMOS;
  wherein a source of the diode connected PMOS is electrically connected to the bias generator to receive the supply voltage;
  wherein a gate of the diode connected PMOS is electrically connected to a drain of the diode connected PMOS, and a gate of the diode connected NMOS;
  wherein the gate of the diode connected NMOS is electrically connected to a drain of the diode connected NMOS;
  wherein a source of the diode connected NMOS is electrically connected to the ground.

10. The low voltage inverter-based amplifier as claimed in claim 8, wherein the second inverter-based amplification module further comprises:
  a fifteenth inverter, comprising an inverter input and an inverter output; wherein the inverter output of the fifteenth inverter is electrically connected to the inverter input of the fifth inverter, and the inverter input of the fifteenth inverter is electrically connected to the inverter output of the thirteenth inverter to receive the feedback signal; and
  a sixteenth inverter, comprising an inverter input and an inverter output; wherein the inverter output of the sixteenth inverter is electrically connected to the inverter input of the eighth inverter, and the inverter input of the sixteenth inverter is electrically connected to the inverter output of the thirteenth inverter to receive the feedback signal;
  wherein the fifteenth inverter and the sixteenth inverter each comprise:
    a PMOS; wherein a source of the PMOS is electrically connected to the bias generator to receive the supply voltage;
    an NMOS; wherein a gate of the NMOS is electrically connected to a gate of the PMOS, a drain of the NMOS is electrically connected to a drain of the PMOS, and a source of the NMOS is electrically connected to the ground;
    wherein the gate of the PMOS is the inverter input, and the drain of the PMOS is the inverter output.

11. The low voltage inverter-based amplifier as claimed in claim 2, wherein the bias generator is electrically connected to a converter to receive a power supply voltage, and comprises:
  a first PMOS; wherein a source of the first PMOS is electrically connected to the converter to receive the power supply voltage;
  a second PMOS; wherein a source of the second PMOS is electrically connected to the converter to receive the power supply voltage, and a gate of the second PMOS is electrically connected to a gate of the first PMOS and a drain of the second PMOS;

a third PMOS; wherein a source of the third PMOS is electrically connected to the converter to receive the power supply voltage, and a gate of the third PMOS is electrically connected to the drain of the second PMOS;

a first NMOS; wherein a drain of the first NMOS is electrically connected to a drain of the first PMOS and a gate of the first NMOS, and a source of the first NMOS is electrically connected to the ground;

a second NMOS; wherein a drain of the second NMOS is electrically connected to the drain of the second PMOS, and a gate of the second NMOS is electrically connected to the gate of the first NMOS;

a third resistor, electrically connected between a source of the second NMOS and the ground;

a third NMOS; wherein a drain of the third NMOS is electrically connected to a drain of the third PMOS and a gate of the third NMOS, and a source of the third NMOS is electrically connected to the ground;

a first amplifier, comprising a first positive port, a first negative port, a first positive power port, a first negative power port, and a first output port; wherein the first positive port is electrically connected to the drain of the third PMOS, the first positive power port is electrically connected to the converter to receive the power supply voltage, and the first negative power port is electrically connected to the ground;

a fourth PMOS; wherein a source of the fourth PMOS is electrically connected to the first output port, and a gate of the fourth PMOS is electrically connected to a drain of the fourth PMOS and the first negative port;

a fourth NMOS; wherein a drain of the fourth NMOS is electrically connected to a gate of the fourth NMOS, the drain of the fourth NMOS outputs the common mode voltage, and a source of the fourth NMOS is electrically connected to the ground; and a second amplifier, comprising a second positive port, a second negative port, a second positive power port, a second negative power port, and a second output port; wherein the second positive port is electrically connected to the first output port, the second negative port is electrically connected to the second output port, the second positive power port is electrically connected to the converter to receive the power supply voltage, the second negative power port is electrically connected to the ground, and the second output port outputs the supply voltage.

12. The low voltage inverter-based amplifier as claimed in claim 11, wherein the second PMOS and the fourth PMOS are each a diode connected PMOS, and the first NMOS and the third NMOS are each are a diode connected NMOS.

* * * * *